United States Patent
Chen et al.

(10) Patent No.: US 8,213,234 B2
(45) Date of Patent: *Jul. 3, 2012

(54) CURRENT SINK SYSTEM FOR SOURCE-SIDE SENSING

(75) Inventors: Chung-Kuang Chen, Taipei (TW); Han-Sung Chen, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 187 days.

This patent is subject to a terminal disclaimer.

(21) Appl. No.: 12/833,523

(22) Filed: Jul. 9, 2010

(65) Prior Publication Data

US 2011/0085384 A1   Apr. 14, 2011

Related U.S. Application Data

(63) Continuation-in-part of application No. 12/576,466, filed on Oct. 9, 2009, now Pat. No. 8,064,263.

(51) Int. Cl.
*G11C 16/04* (2006.01)

(52) U.S. Cl. .............................. 365/185.21; 365/185.2

(58) Field of Classification Search ............. 365/185.21, 365/185.2, 185.25
See application file for complete search history.

(56) References Cited

U.S. PATENT DOCUMENTS

| | | | |
|---|---|---|---|
| 6,272,043 B1 | 8/2001 | Hollmer | |
| 6,731,542 B1 | 5/2004 | Le et al. | |
| 6,771,543 B2 | 8/2004 | Wong et al. | |
| 7,295,471 B2 | 11/2007 | Hsieh et al. | |
| 7,339,846 B2 | 3/2008 | Lin et al. | |
| 2005/0117407 A1* | 6/2005 | Theel | 365/189.09 |
| 2009/0086534 A1 | 4/2009 | DeBrosse et al. | |
| 2009/0251958 A1* | 10/2009 | Bauser | 365/174 |
| 2011/0085383 A1* | 4/2011 | Hung et al. | 365/185.21 |
| 2011/0216601 A1* | 9/2011 | Liao et al. | 365/185.21 |
| 2012/0033518 A1* | 2/2012 | Hung et al. | 365/210.1 |

* cited by examiner

*Primary Examiner* — Vu Le

(74) *Attorney, Agent, or Firm* — Haynes Beffel & Wolfeld LLP

(57) ABSTRACT

Source-side sensing techniques described herein determine the data value stored in a memory cell based on the difference in current between the read current from the source terminal of the memory cell and a sink current drawn from the read current. The sink current is drawn in response to the magnitude of a reference current provided by a reference current source such as a reference cell.

20 Claims, 17 Drawing Sheets

CURRENT SINK SYSTEM FOR SOURCE-SIDE SENSING

RELATED APPLICATIONS

The present application is a continuation-in-part of U.S. patent application Ser. No. 12/576,466 filed on 9 Oct. 2009, now U.S. Pat. No. 8,064,263.

BACKGROUND OF THE INVENTION

1. Field of the Invention

The present invention relates to sense circuitry for memory devices, and more particularly to source-side sense circuitry for such devices.

2. Description of Related Art

There is a variety of types of non-volatile memory based on charge storage memory cells, including memory cells that store charge between the channel and gate of a field effect transistor. The amount of charge stored affects the threshold voltage of the transistor, which can be sensed to indicate data.

One type of charge storage memory cell is known as a floating gate memory cell. In a floating gate memory cell, charge is stored on an electrically conductive layer between the channel and gate of the transistor. The threshold voltage is changed by storing or removing charge on the electrically conductive layer by applying appropriate voltages to a memory cell. Another type of memory cell is referred to as a charge trapping memory cell, which uses a dielectric charge trapping layer in place of the floating gate.

In a read operation, appropriate voltages are applied to induce a current to flow from the drain terminal to the source terminal of the memory cell. The current is dependent upon the threshold voltage of the transistor and thus indicates the data stored therein.

Reading the data stored in a selected memory cell can be carried out by sensing the current at a drain terminal ("drain-side sensing"), or by sensing the current at a source terminal ("source-side sensing").

In drain-side sensing, a data line (e.g. bit line) connected to the drain terminal of the selected memory cell is coupled to a sensing circuit. Appropriate bias voltages are applied to the memory cell to induce a current to flow from the data line to the drain terminal through to the source terminal of the memory cell. The sensing circuit senses the current drawn from the data line by the memory cell, and compares the sensed current to a suitable reference or references to determine the data stored in the cell. See, for example, U.S. Pat. Nos. 7,295,471; 6,272,043; 7,339,846; 6,731,542; and 6,771,543.

In source-side sensing, a data line connected to the source terminal of a selected memory cell is coupled to a sensing circuit. Appropriate bias voltages are applied to the memory cell to induce a read current to flow from the drain terminal to the source terminal and onto the data line. The sensing circuit senses the read current on the data line, and compares the sensed current to a suitable reference or references to determine the data stored in the cell. For source-side sensing, the sensing circuit typically senses the read current at a node having a voltage at or near ground potential.

The read current can be sensed by using the read current to charge a capacitance, which can be modeled as an equivalent load capacitor, at the sensing input of a sense amplifier of the sensing circuit. The change in voltage at the sensing input depends on the read current, and thus indicates the data stored in the selected memory cell.

In source-side sensing the sensing input of the sense amplifier is coupled to the source terminal of the memory cell. As a result, a specific issue arising in source-side sensing is that the voltage on the source terminal will also increase by an amount dependent upon the read current. The increase in voltage on the source terminal decreases the drain-to-source voltage and increases the body effect of the selected memory cell. This in turn reduces the read current provided by the memory cell.

The threshold voltages of memory cells in an array will vary because of variations in the operating environment, as well as in materials and manufacturing processes. These variations result in differences in read current among memory cells storing the same data value, including differences in the change in read current caused by an increase in the source voltage. Thus, having the source voltage increase by an amount dependent upon the read current results in a wide distribution of the voltage or current at the sensing input of the sense amplifier. The need to operate in these conditions increases the complexity of sense circuitry and/or the time needed for sensing.

It is therefore desirable to provide source-side sense circuitry addressing the issues caused by the variation in source voltage during reading, as well as methods for operating such circuitry.

SUMMARY OF THE INVENTION

Source-side sensing techniques described herein determine the data value stored in a memory cell based on the difference in current between the read current from the source terminal of the memory cell and a sink current drawn from the read current. The sink current can be regulated so that it is essentially independent of the read current.

Using the difference between the read current and the sink current, rather than using the entire read current, reduces the amount of voltage variation at the source terminal of the memory cell during the sensing operation. This is turn reduces the variation in the read current among cells in the array during source-side sensing. As a result, the distribution in the voltage or current on the sensing node among memory cells in the array will be tightened.

A memory device includes a memory array arranged to provide a read current from a source terminal of a selected memory cell to a data line. A reference current source is arranged to provide a reference current to a reference line. A regulated sink current source is coupled to the data line, and arranged to draw a sink current having a regulated magnitude from the data line. Also in embodiments described herein, a sink current having a regulated magnitude is drawn from the reference line. Sense amplifier circuitry is coupled to the data line and responsive to a difference between the read current and the sink current to generate an output signal indicating a data value stored in the selected memory cell. Sense amplifier circuitry can operate based on comparing a reference sensing current based on the difference between the reference current and the sink current drawn from the reference line and a read sensing current based on the difference between the read current and the sink current drawn from the data line.

A regulated sink current source is described which maintains a magnitude of the sink current on the data line independent of a magnitude of the read current. A regulated current source is described which maintains a magnitude of the sink current as a function of a magnitude of the reference current, which can be essentially independent of the magnitude of the read current.

A regulated sink current source is described which includes a current mirror having an output supplying the sink current, and an input coupled to a mirror input current source.

The mirror input current source can be the reference current source in some embodiments, or another current source responsive to, correlating with, or emulating, a magnitude of the reference current to supply the mirror input current.

The mirror input current source can be configured so that it includes a sample and hold circuit, which samples a magnitude of the reference current during a sampling interval to produce a sample bias condition, and holds the sample bias condition during the sensing interval of the sense amplifier.

A regulated sink current source can include an operational amplifier or other circuitry which regulates a voltage level at the output, or outputs, of the regulated sink current source. In embodiments in which the regulated sink current source includes a current mirror, a first input of the operational amplifier can be coupled to a feedback node in the regulated sink current source, and a second input of the operational amplifier can be coupled to a reference voltage source, such as ground.

A memory device described herein includes a memory array arranged to provide a read current from a selected memory cell in the memory array to a data line. A reference current source is arranged to provide a reference current. A sink current source is coupled to the data line, and is arranged to draw a sink current from the data line in response to a magnitude of the reference current. The device further includes sense amplifier circuitry having a sensing node coupled to the data line. The sense amplifier circuitry is responsive to difference in current between the cell current and the sink current to generate an output signal indicating a data value stored in the selected memory cell.

The device can further include circuitry to set a reference voltage on a reference node independent of the magnitude of the reference current, where the sense amplifier circuitry is responsive to the difference in voltage on the reference node and the sensing node to generate the output signal. In such a case, the time required to reach the reference voltage can be less than would be required using the reference current to charge the reference node, allowing higher speed operation.

A method for source-side sensing of data in the memory array is described that includes applying a read current from a source-side of a selected memory cell to a data line, and supplying a reference current on a reference line. The method includes drawing regulated sink currents from the data line and from the reference line to produce a read sensing current in response to the difference between the read current and the regulated sink current on the data line, and to produce a reference sensing current in response to difference between the reference current and the regulated sink current on the reference line. Data is determined in a selected memory cell in response to the read sensing current and the reference sensing current. The regulated sink current can be produced by current sources that can be responsive to, correlate with, or emulate the reference current, so that the reference sensing current can be quite small. Also, the regulated sink current can be produced using current mirror circuits, and by sampling a mirror biasing condition based on the reference current, and holding that mirror biasing condition during a sensing interval in order to isolate the regulated sink currents from the reference current during a sensing interval.

A sensing method for a memory cell as described herein includes applying a bias to the memory cell to induce a read current from the memory cell. A reference current is provided from a reference current source, and a sink current is drawn from the read current in response to a magnitude of the reference current. A difference in current between the read current and the sink current is provided to a sensing node. A data value stored in the memory cell is determined based on said difference.

Other aspects and advantages of the present invention can be seen on review of the drawings, the detailed description, and the claims which follow.

DETAILED DESCRIPTION

A detailed description of embodiments of the present invention is provided with reference to the FIGS. 1-19.

Figure 1:
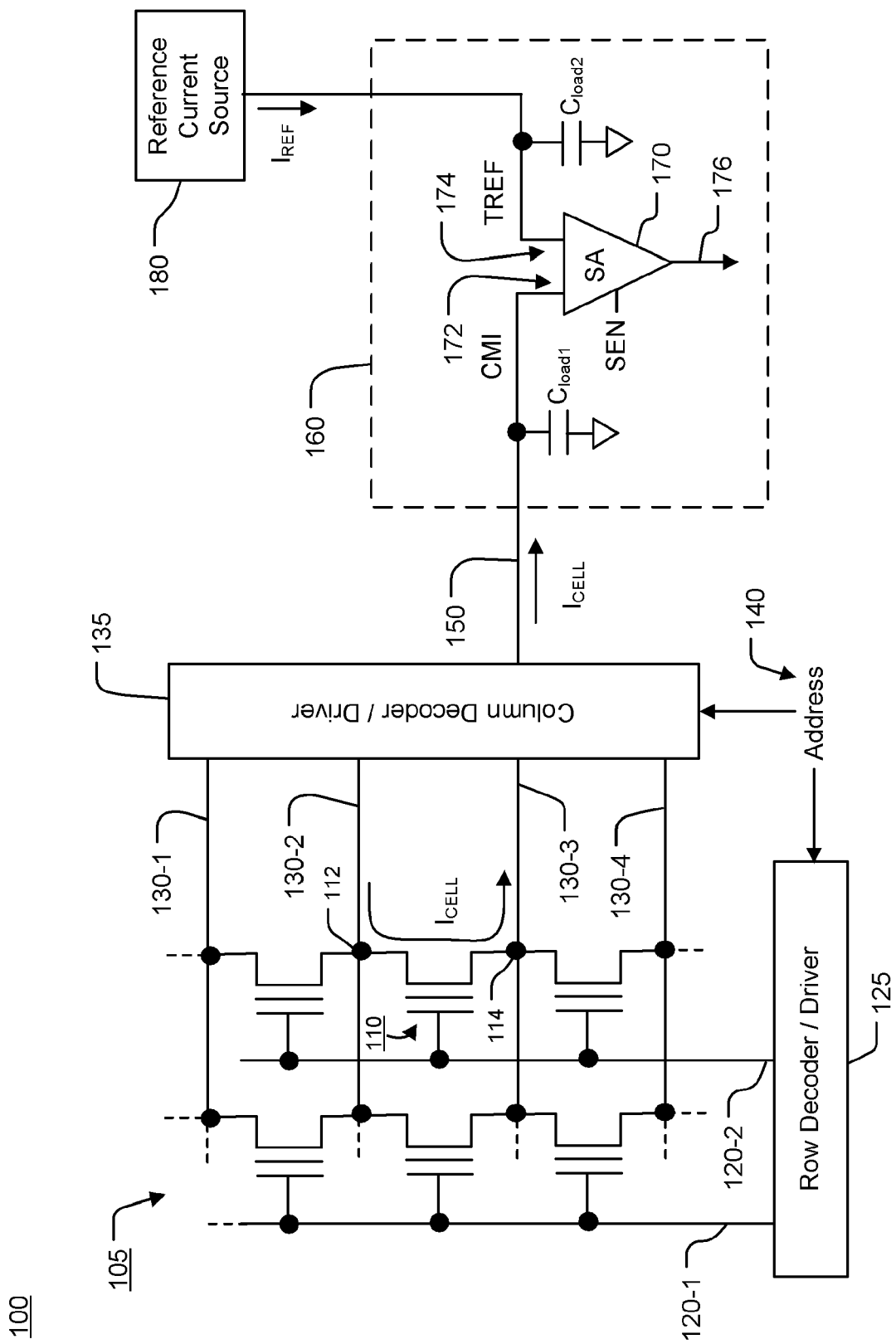
FIG. 1 is a schematic diagram of a prior art memory device implementing a source-side sensing scheme.

FIG. 1 is a schematic diagram of a prior art memory device 100 implementing a source-side sensing scheme for the data value stored in a selected memory cell 110. The device 100 includes an array 105 of memory cells, illustrated in this example in a virtual ground array configuration. The array 105 includes a plurality of word lines including word lines 120-1 and 120-2 extending in a first direction and coupled to the gate terminals of the memory cells in the array 105. The word lines 120-1 and 120-2 are in electrical communication with row decoder/driver 125.

The array 105 also includes a plurality of bit lines including bit lines 130-1 to 130-4 extending in a second direction and coupled to the source and drain terminals of the memory cells in the array 105. The bit lines 130-1 to 130-4 are in electrical communication with column decoder/driver 135.

Memory cell 110 is representative of the memory cells in the array 105. Word line 120-2 is coupled to the gate terminal of the memory cell 110. Bit lines 130-2 and 130-3 are respectively coupled to first and second conduction terminals 112 and 114 of the memory cell 110. The first and second conduction terminals 112, 114 each act as one of the source or drain terminals of the memory cell 110, depending upon the direction of current flow through the cell 110.

In a read or sensing operation for a data value stored in memory cell 110, row decoder/driver 125 is responsive to address signals 140 to apply a read voltage $V_{WL}$ to word line 120-2. Column decoder/driver 135 is responsive to the address signals 140 to apply a read voltage $V_{BL}$ to bit line 130-2, and to couple bit line 130-3 to a data line 150 of sense circuitry 160. The read voltages applied to the word line 120-2 and bit line 130-2 induce a read current $I_{CELL}$ from the terminal 112 acting as a drain to the terminal 114 acting as a source and onto the bit line 130-3.

The read current $I_{CELL}$ on the bit line 130-3 from the source terminal 114 of the selected cell 110 is provided via data line 150 to a sensing input 172 of sense amplifier 170. The read current $I_{CELL}$ charges a node capacitance $C_{LOAD1}$ at the sensing input 172 of the sense amplifier 170, causing the sensing voltage (CMI) to change by an amount proportional to the read current $I_{CELL}$ over the duration of the read operation. Thus, the voltage at the sensing input 172 will change more rapidly if the selected cell 110 is in a lower threshold state than if the selected cell is in a higher threshold state.

Figure 2:
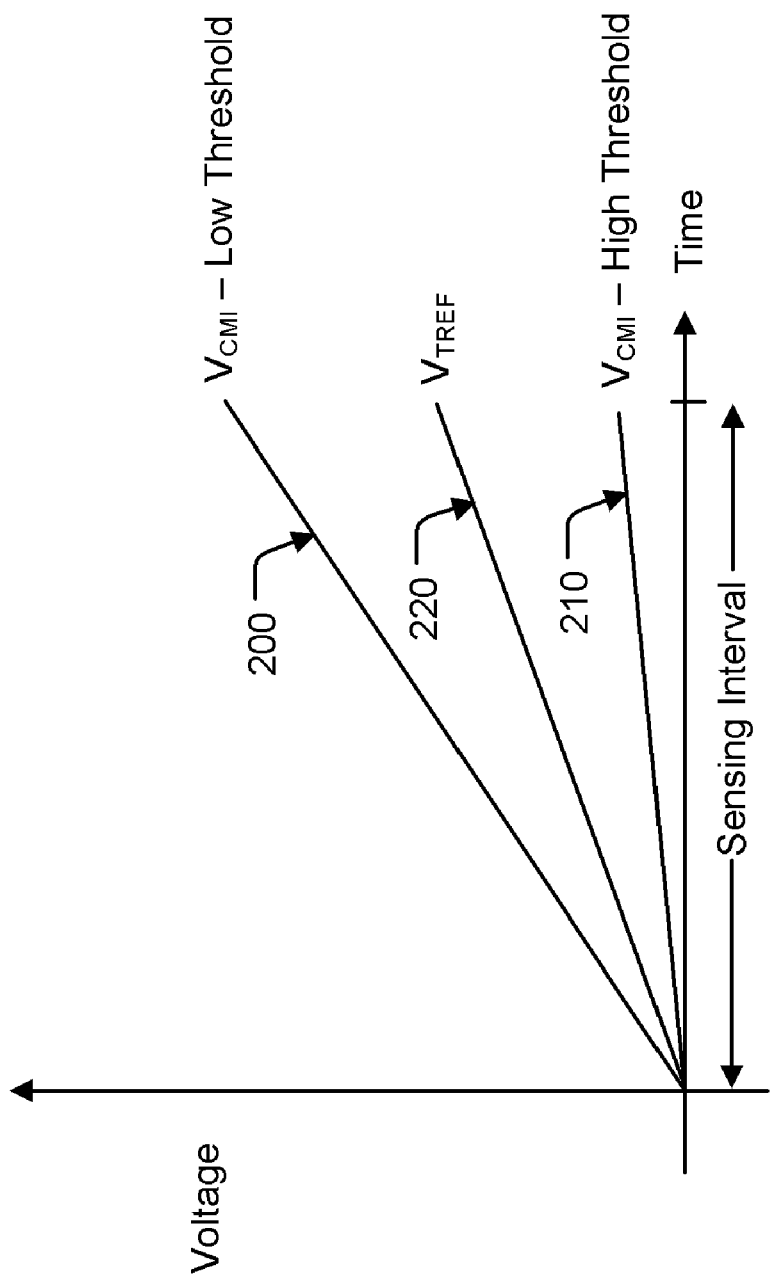
FIG. 2 is a simplified illustration of the change in voltage at the sensing input of the sensing amplifier versus time.

FIG. 2 is a simplified illustration of the change in voltage at the sensing input 172 operation versus time, for memory cell 110 having one of two states. Curve 200 illustrates the change in voltage at the sensing input 172 if the selected memory cell 110 is in the low threshold state. Curve 210 illustrates the change in voltage at the sensing input 172 if the selected memory cell 110 is in the low threshold state. The difference between the curves 200 and 210 following the sensing interval is a sensing margin used to distinguish the cells in the low threshold state from those in the high threshold state. In order to reliably distinguish between the threshold states, it is important to maintain a relatively large sensing margin.

Referring back to FIG. 1, a reference current source 180 provides a reference current $I_{REF}$ to a reference input 174 of the sense amplifier 170. The reference current $I_{REF}$ charges a node capacitance $C_{LOAD2}$ at the reference input 174 of the sense amplifier 170, converting the reference current $I_{REF}$ to a reference voltage (TREF). Curve 220 in FIG. 2 illustrates the change in voltage at the reference input 174 versus time.

A sense enabled signal SEN is applied to the sense amplifier 170 to define the sensing interval for the read operation of the selected memory cell 110. The sense amplifier 170 is responsive to the difference in voltages at the inputs 172, 174 to generate an output signal 176 indicating the data value stored in the selected memory cell 110.

Because the sensing input 172 is coupled to the source terminal 114 of the memory cell 110, the voltage on the source terminal 114 will also increase by an amount dependent upon the read current $I_{CELL}$. The increase in voltage on the source terminal 114 decreases the drain-to-source voltage and increases the body effect of the memory cell 110, which in turn reduces the read current $I_{CELL}$.

The threshold voltages of the memory cells will vary across the array 105 because of variations in the operating environment, as well as variations in materials and manufacturing processes. These variations result in differences in read current $I_{CELL}$ among cells in the array 105 storing the same data value, and in differences in change in the read current $I_{CELL}$ caused by an increase in the source voltage. Thus, having the source voltage increase by an amount dependent upon the read current $I_{CELL}$ results in a wide distribution of the voltage or current at the sensing input 172, which increases the complexity or the time needed for sensing.

Figure 3:
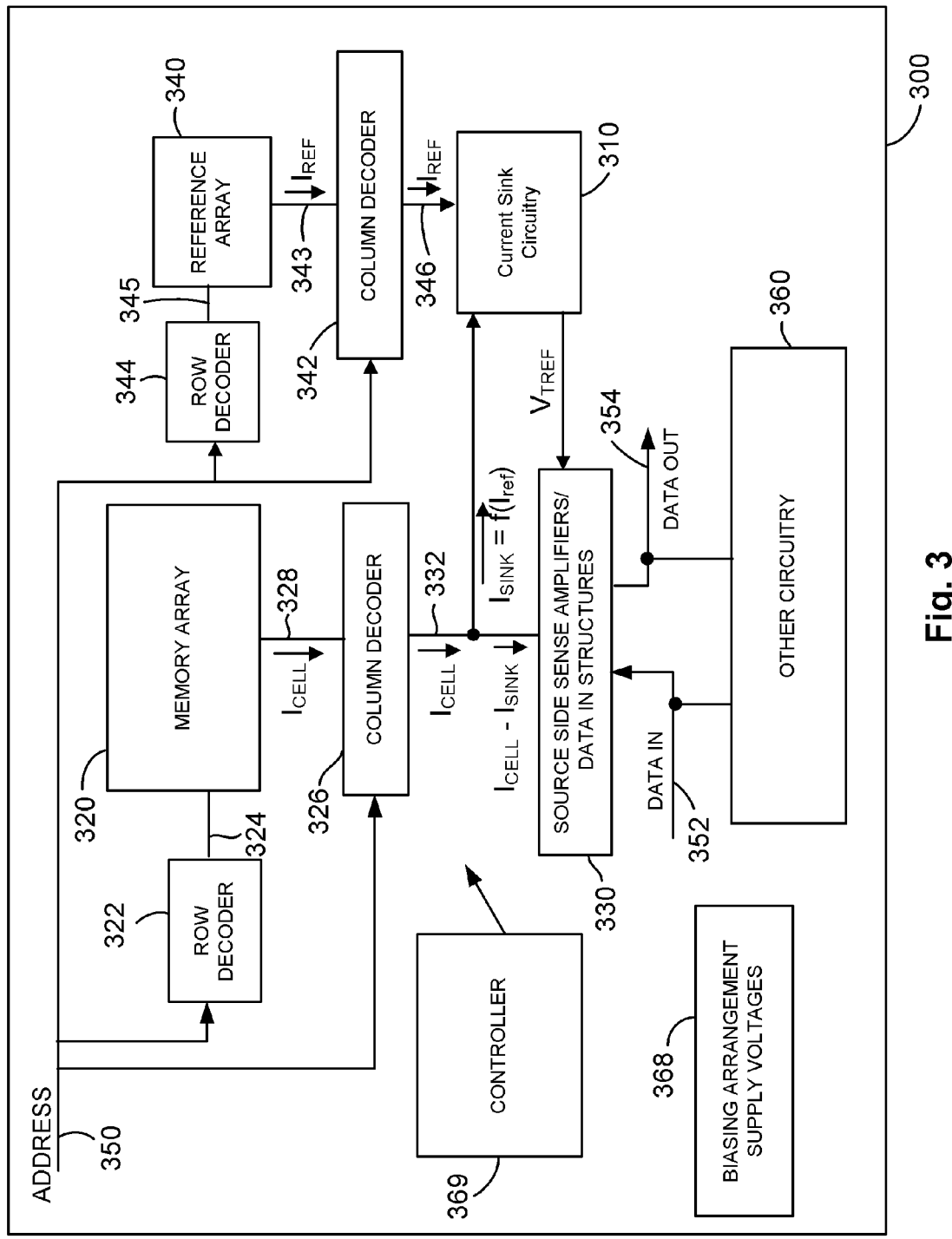
FIG. 3 is a simplified block diagram of an integrated circuit device including current sink circuitry for implementing source-side sensing techniques described herein.

FIG. 3 is a simplified block diagram of an integrated circuit 300 including current sink circuitry 310 used for implementing source-side sensing for a memory array 320 as described herein.

A row decoder 322 is coupled to a plurality of word lines 324 arranged along rows in the memory array 320. A column decoder 326 is coupled to a plurality of bit lines 328 arranged along columns in the memory array 320 for reading and programming data from the memory cells in the array 320. Sense amplifiers and data-in structures in block 330 are coupled to the column decoder 326 in this example via data bus 332. The memory cells of the array 320 may for example be arranged in series, in parallel, or in a virtual ground array.

As described in more detail below, the current sink circuitry 310 is coupled to the data bus 332 to draw a sink current $I_{SINK}$ in response to, correlating with, or emulating, the magnitude of a reference current $I_{REF}$ during source-side sensing of the memory cells in array 320. The current sink circuitry 310 also provides a reference voltage $V_{TREF}$ to the reference input of sense amplifiers of block 330 during the sensing of the memory cells in array 320.

In the illustrated embodiment the reference current $I_{REF}$ is provided to the current sink circuitry 310 via bus 346 and column decoder 342 using a reference cell in reference array 340. Other techniques for providing the reference current $I_{REF}$ can alternatively be used. For example, the reference current $I_{REF}$ can be based on the reference currents in more than one reference cell. In other embodiments, the reference current $I_{REF}$ is not supplied to the current sink circuit 310, as described below.

Row decoder 344 is coupled to word lines 345 arranged along rows in the reference array 340. Column decoder 342 is coupled to bit lines 343 arranged along columns in the reference array 340. In the illustrated embodiment the reference array 340 is shown separate from the memory array 320, and includes separate row and column decoders 344, 342. Alternatively, the reference array 340 may be implemented as part of the memory array 320, with the decoders shared among the arrays 320, 340.

During source-side sensing, the difference in current between the read current $I_{CELL}$ and the sink current $I_{SINK}$ is provided to a sensing node, thereby setting a current or voltage on the sensing node. A sense amplifier in block 330 has a sensing input coupled to the sensing node, and is responsive to the current or voltage on the sensing node to generate an output signal indicating the data stored in the selected memory cell.

Since the voltage on the sensing input of the sense amplifier depends upon the difference between the read current $I_{CELL}$ and the sink current $I_{SINK}$, rather than the entire read current $I_{CELL}$, the variation in voltage at the source terminal of the selected memory cell is reduced. This is turn reduces the variation in the read current $I_{CELL}$ among cells in the array 320 during source-side sensing. As a result, the distribution in the voltage or current on the sensing input of the sense amplifiers of block 330 across the array will be tightened.

Addresses are supplied on bus 350 to column decoders 326, 342 and row decoders 322, 344. Data is supplied via the data-in line 352 from input/output ports on the integrated circuit 300, to the data-in structures in block 330. In the illustrated embodiment, other circuitry 360 is included on the integrated circuit 300, such as a general purpose processor or special purpose application circuitry, or a combination of modules providing system-on-a-chip functionality. Data is supplied via data-out line 354 from the sense amplifiers of block 330 to input/output ports on the integrated circuit 300, or to other data destinations internal or external to the integrated circuit 300.

The integrated circuit 300 includes a controller 369 for reading, programming, and erasing the memory cells of the memory array 320 and reference array 340. The controller 369, implemented in this example using a bias arrangement state machine, controls the application of bias arrangement supply voltages generated or provided through the voltage supply or supplies in block 368, such as read, program and erase voltages. The controller 369 can be implemented using special-purpose logic circuitry as known in the art. In alternative embodiments, the controller 369 comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller 369.

Figure 4:
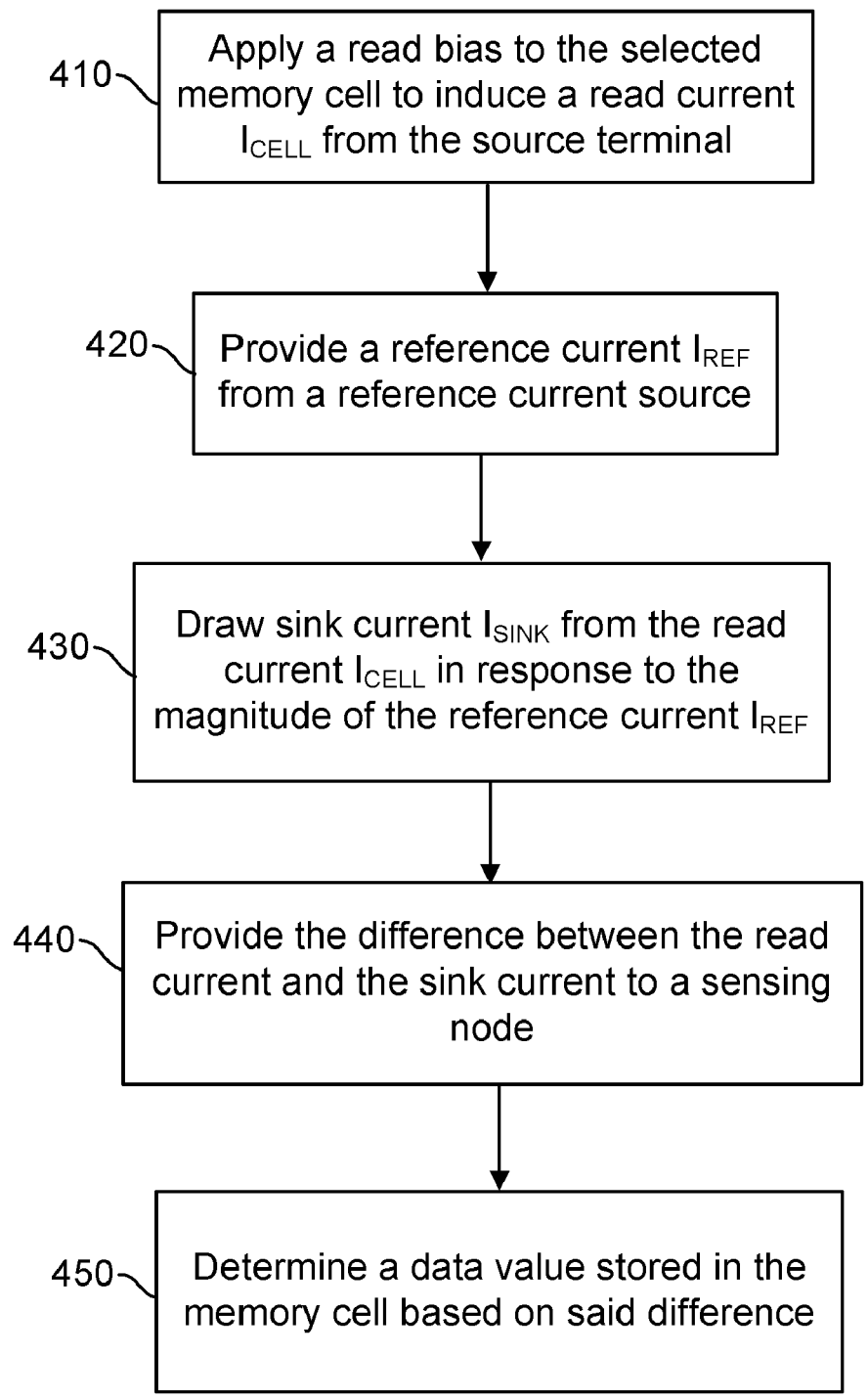
FIG. 4 illustrates a flow diagram of a source-side sensing method for reading the data value stored in the selected memory cell.

FIG. 4 is a simplified flow diagram of a source-side sensing method 400 for a selected memory cell in the memory array 320. It will be appreciated that some of the blocks in FIG. 4 may be combined or performed in parallel.

At block 410 a read bias is applied to the selected memory cell to induce a read current $I_{CELL}$ from the source terminal of the selected cell.

At block 420, reference current $I_{REF}$ is provided from a reference current source. In the illustrated embodiment of FIG. 3, the reference current $I_{REF}$ is a read current from a reference cell in reference array 340. The reference current $I_{REF}$ is thus provided by applying appropriate bias voltages to the reference cell to induce the reference current $I_{REF}$.

At block 430, a sink current $I_{SINK}$ is drawn from the read current $I_{CELL}$ by the current sink circuitry 310 in response to the magnitude of, or in a manner emulating or correlating with the magnitude of, the reference current $I_{REF}$. Also, a sink current $I_{SINK}$ is drawn from the reference current in some embodiments.

At block 440, the difference in current between the read current $I_{CELL}$ and the sink current $I_{SINK}$ is provided to a sensing node coupled to a sensing input of a sense amplifier in block 330.

At block 450, the data value stored in the selected memory cell is determined based on the difference in current between the read current $I_{CELL}$ and the sink current $I_{SINK}$.

Figure 5:
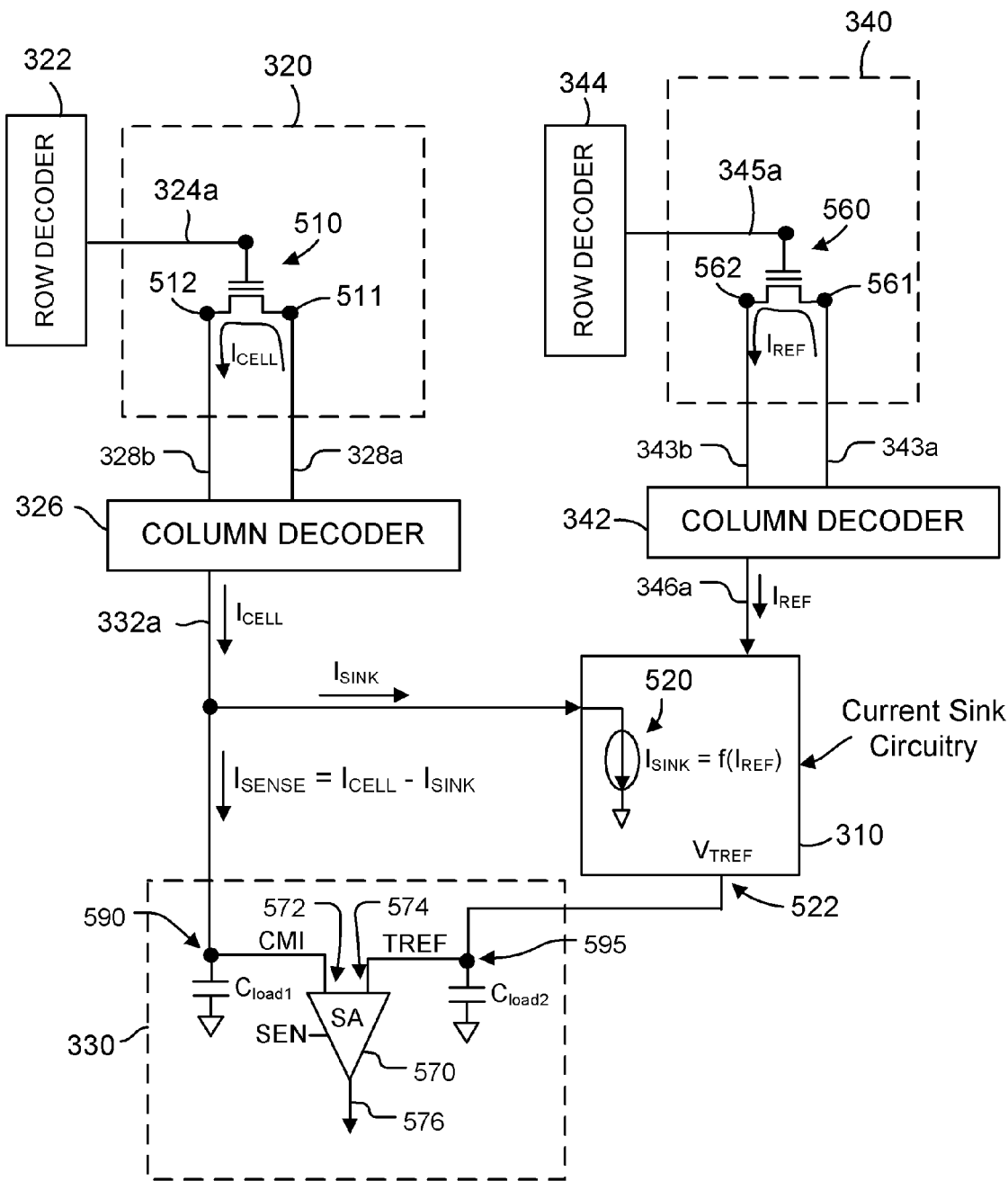
FIG. 5 illustrates a simplified schematic diagram of the current sink circuitry during source-side sensing of a selected memory cell.

FIG. 5 illustrates a simplified schematic diagram of the current sink circuitry 310 for source-side sensing of a selected memory cell 510 in memory array 320.

As shown in FIG. 5, word line 324a is coupled to the gate of the selected memory cell 510. Bit line 328a is coupled to the drain terminal 511, and bit line 328b is coupled to the source terminal 512. During source-side sensing, the column decoder 326 couples the bit line 328b to data line 332a.

The current sink circuitry 310 receives the reference current $I_{REF}$ on data line 346a provided in this example by a reference cell 560 in the reference array 340. As discussed above, other techniques for providing the reference current $I_{REF}$ may alternatively be implemented. Bit line 343a is coupled to the drain terminal 561 of the reference cell 560, and bit line 343b is coupled to the source terminal 562. During source-side sensing, the column decoder 342 couples the bit line 343b to data line 346a.

The current sink circuitry 310 includes a sink current source 520 coupled to the data line 332a. The sink current source 520 draws a sink current $I_{SINK}$ from the cell current $I_{CELL}$. As shown by embodiments described herein, the sink current source 520 can be implemented using a current mirror, providing a sink current having a magnitude that is directly proportional to the magnitude of a current mirror input source, such as the reference current source or other current source. For example, the magnitude of the sink current $I_{SINK}$ may be substantially the same as that of the reference current $I_{REF}$. Alternative techniques for implementing the sink current source 520 may also be used.

The current sink circuitry 310 also has an output 522 providing a reference voltage $V_{TREF}$ to bias reference node 595. The reference node 595 is coupled to the reference input TREF 574 of the sense amplifier 570.

Sensing current $I_{SENSE}$/the difference between the read current $I_{CELL}$ and the sink current $I_{SINK}$, is provided to a sensing node 590. The sensing node 590 is coupled to the sensing input CMI 572 of sense amplifier 570.

The sensing current $I_{SENSE}$ can be converted to a voltage on the sensing node 590 by charging of node capacitance $C_{LOAD1}$. The sense amplifier 570 is responsive to the difference between the voltage on the sensing node 590 coupled to the sensing input CMI 572, and the reference node 595 coupled to the reference input 574, to generate output signal 576 indicating the threshold state of the selected cell 510.

Since the voltage on the sensing input CMI 572 of the sense amplifier 570 depends upon the difference between the read current $I_{CELL}$ and the sink current $I_{SINK}$, rather than the entire sink current $I_{SINK}$, the variation in voltage at the source terminal 512 of the selected memory cell 510 is reduced. This in turn reduces the variation in the read current $I_{CELL}$ among cells in the array 320 during source-side sensing. As a result, the distribution in voltage at the sensing input 572 of the sense amplifier will be tightened.

Additionally, using the current sink circuitry 310 to bias the reference node 595, rather than using the reference current $I_{REF}$ to charge the node capacitance $C_{LOAD2}$, allows higher speed operation.

When using the reference current $I_{REF}$ to charge the reference node 595, the time required to reach a reference voltage correlates with the threshold voltage of the reference cell. Thus, the sensing operation must be performed after a specified time in which the reference node should have obtained the reference voltage value. By using the current sink circuitry 310 to bias the reference node 595, the time required to reach the reference voltage is shorter than would be required using the reference current $I_{REF}$ to charge the reference node 595.

Figure 6:
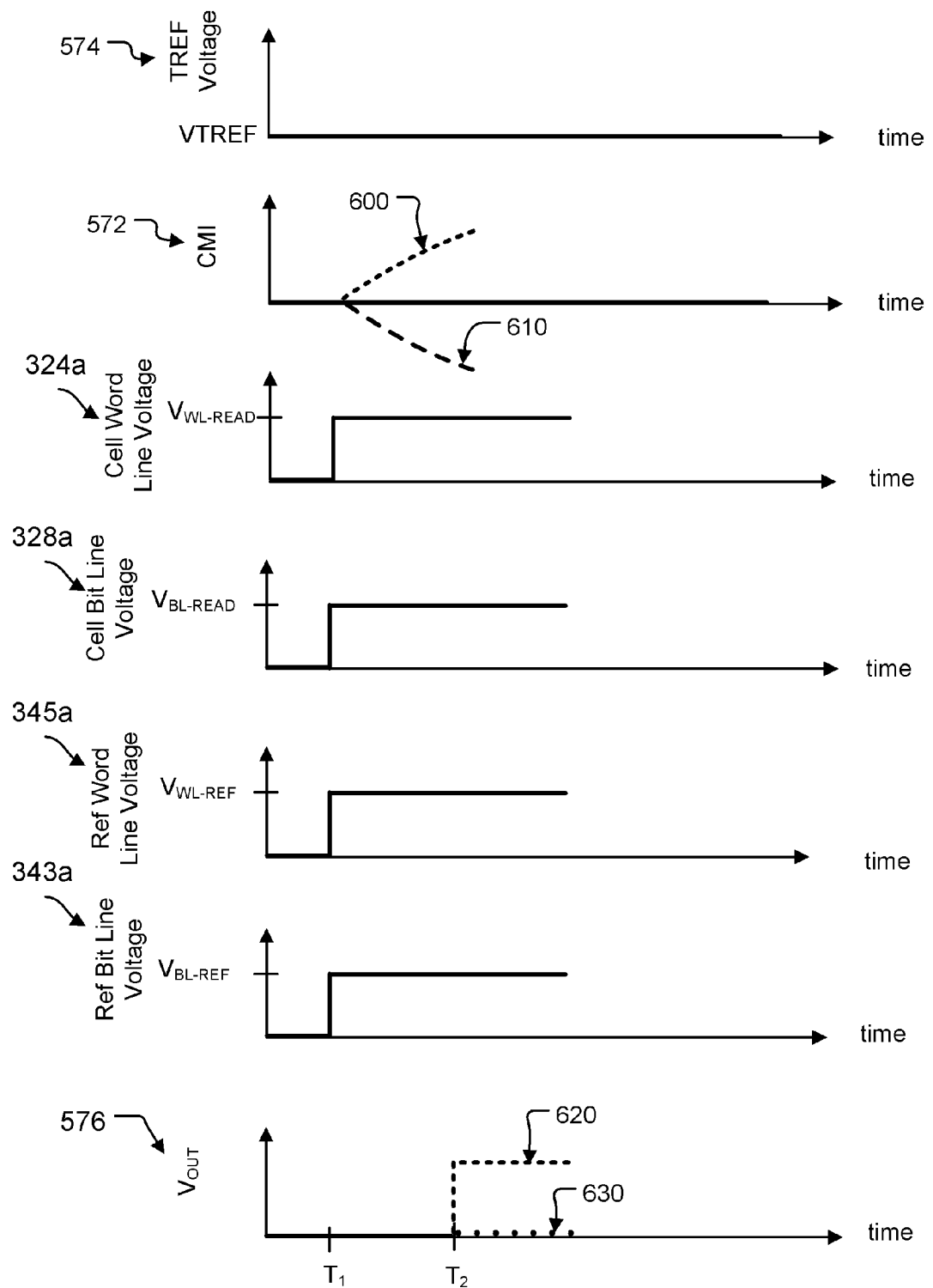
FIG. 6 illustrates a timing diagram for operating the architecture of FIG. 5.

FIG. 6 illustrates a timing diagram for operating the architecture of FIG. 5 to sense the data value stored in the selected memory cell 510 using the source-side sensing techniques described herein. It will be understood that the timing diagram of FIG. 6 is simplified and not necessarily to scale.

At time $T_1$ row decoder 322 is responsive to address signals to apply a read voltage $V_{WL\text{-}READ}$ to word line 324a coupled to the gate of the selected memory cell 510. Column decoder 326 is responsive to the address signals to apply a read voltage $V_{BL\text{-}READ}$ to bit line 328a coupled to the drain terminal 511 of the selected memory cell 510, and to couple bit line 328b to data line 332a. The read voltages applied to the word line 324a and bit line 328a induce a read current $I_{CELL}$ from the drain terminal 511 to the source terminal 512, and onto the bit line 328b and the data line 332a.

Row decoder 344 is responsive to address signals to apply voltage $V_{WL-REF}$ to word line 345a coupled to the gate of the reference cell 560. Column decoder 342 is responsive to address signals to apply voltage $V_{BL-REF}$ to bit line 343a coupled to the drain terminal 561 of the reference cell 560, and to couple bit line 343b to data line 346a. The voltages applied to the word line 345a and bit line 343a induce the reference current $I_{REF}$ from the drain terminal 561 to the source terminal 562, to the bit line 343b, onto the data line 346a and into the current sink circuitry 310.

Sink current source 520 in the current sink circuitry 310 is coupled to the data line 332a. The sink current source 520 draws the sink current $I_{SINK}$ from the read current $I_{CELL}$.

Sensing current $I_{SENSE}$, the difference between the read current $I_{CELL}$ and the sink current $I_{SINK}$, is provided to the sensing node 590. The sensing node 590 is coupled to the sensing input CMI 572 of the sense amplifier 570.

The sensing current $I_{SENSE}$ is converted to a voltage on the sensing node 590 by charging of node capacitance $C_{LOAD1}$. Thus, the voltage on the sensing node 590 and sensing input CMI 572 will change more rapidly if the selected cell 510 is in a lower threshold state than if the selected cell 510 is in a higher threshold state. In FIG. 6 the voltage on the sensing input CMI 572 tracks upward along curve 600 if the selected cell 510 is in the lower threshold state, and tracks downward along curve 610 if the selected cell is in the higher threshold state. Although only two curves are shown in FIG. 6, it will be understood that more than two curves will be obtained in multi-bit operations.

At time $T_2$, the sense amplifier 570 is responsive to the difference between the voltage on the sensing node 590 coupled to the sensing input CMI 572 and the reference voltage $V_{TREF}$ on the reference node 595 coupled to the reference input 574, to generate output signal $V_{OUT}$ 576 indicating the threshold state of the selected cell 510. In FIG. 6 $V_{OUT}$ is a first voltage 620 if the selected cell 510 is in the lower threshold state, and is a second voltage 630 if the selected cell 510 is in the higher threshold state.

In the illustrated embodiment the sensing operation determines whether the memory cell 510 is in one of two states. More generally, the sensing methods described herein can be implemented in multi-bit memory cells programmable to more than two threshold voltage states. For example, in multi-bit embodiments a plurality of reference currents or reference voltages may be used.

Figure 7:
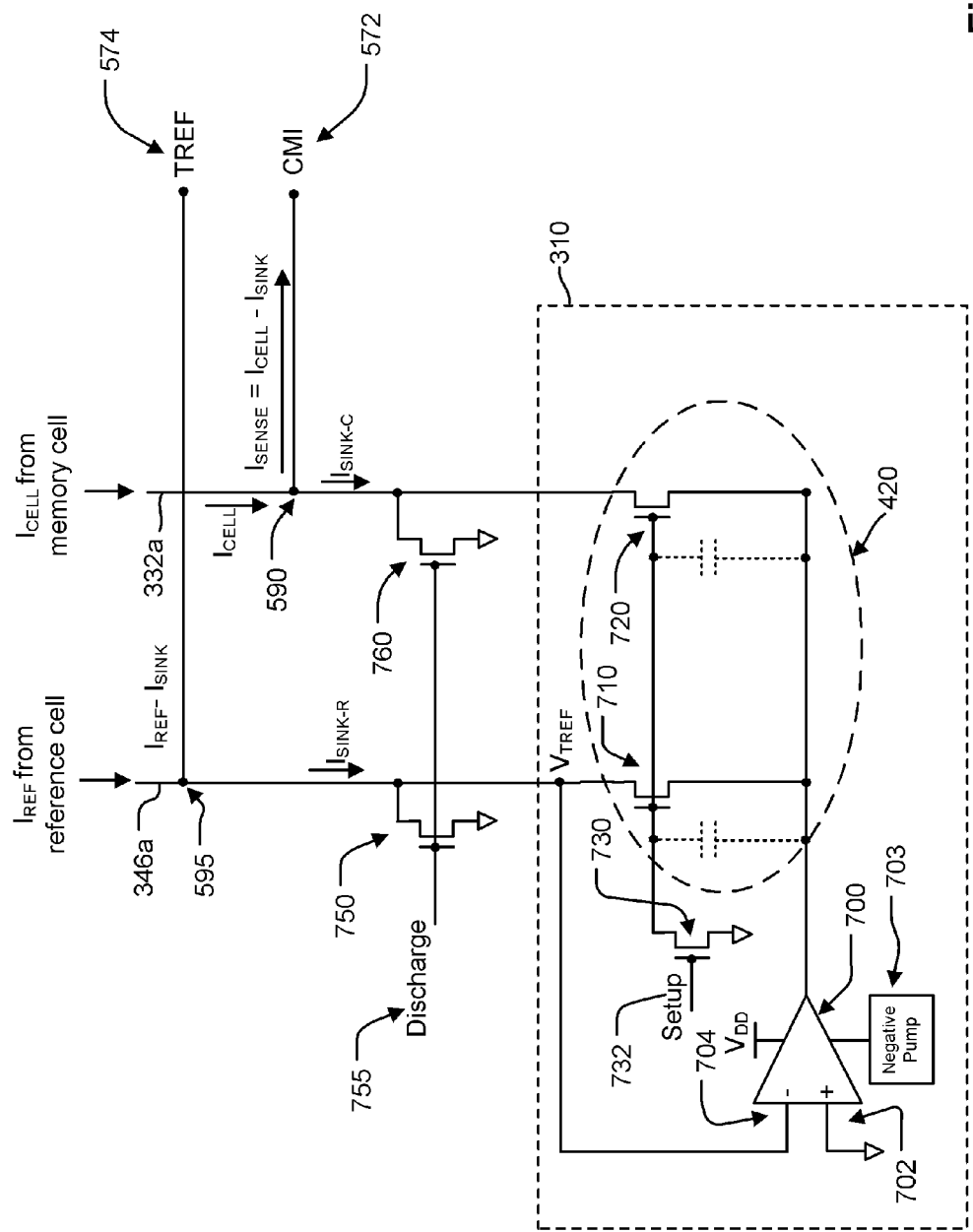
FIG. 7 is a schematic diagram of a first embodiment of the current sink circuitry.

FIG. 7 is a schematic diagram of a first embodiment of the current sink circuitry 310. The current sink circuitry 310 includes a current mirror and an operational amplifier 700 used to bias the reference node 595 at the reference voltage $V_{TREF}$. The operational amplifier 700 has a first input 702 coupled to a reference voltage source, such as ground, and has a second input 704 coupled to the drain of transistor 710, at the reference node 595. As a result, the reference voltage $V_{TREF}$ on the reference node 595 is biased close to ground by the operational amplifier 700, and the voltage $V_{TREF}$ is independent of the reference current $I_{REF}$. In the illustrated embodiment the reference voltage $V_{TREF}$ is ground. Alternatively, other bias voltages and techniques for biasing the reference node 595 may be used.

Supply voltage $V_{DD}$ and negative pump circuitry 703 provide bias voltages to the operational amplifier 700.

The sink current source 520 in the illustrated embodiment has an input leg coupled to a mirror input current source, which is the reference current source supplying $I_{REF}$ in this embodiment, and has an output leg supplying $I_{SINK}$ to the data line 332a. The input leg and output legs are implemented using transistors 710 and 720, respectively, connected in a current mirror arrangement. Transistor 710 has a first conduction terminal connected to data line 346a and reference node 595 to receive the reference current $I_{REF}$ provided by the reference cell 560. Transistor 720 has a first conduction terminal connected to the sensing node 590 to draw the sink current $I_{SINK}$ from the read current $I_{CELL}$ in response to the magnitude of the reference current $I_{REF}$.

The second conduction terminals of the transistors 710 and 720 are commonly connected to the output of the operational amplifier 700. The gates of the transistors 710 and 720 are commonly connected to a setup transistor 730. Prior to performing the sensing operation, Setup signal 732 turns on the transistor 730 to bias the gates of the transistors 710 and 720 to the appropriate bias voltage, discharging node capacitance illustrated in the diagram by dotted lines. In the illustrated embodiment, the gates of transistors 710 and 720 are biased to ground. Alternatively, other bias voltages may be used. The output of the operational amplifier 700 provides a feedback voltage that regulates the drain-to-source voltage of the transistors 710 and 720, so as to supply the current $I_{SINK}$, while the drain terminals are close to ground.

Also shown in FIG. 7 are discharge transistors 750 and 760 coupled to the data line 346a and sensing node 590. The gates of the discharge transistors 750, 760 are coupled to a discharge signal 755 used to couple the reference node 595 and sensing node 590 to ground prior to the sensing operation.

Figure 8:
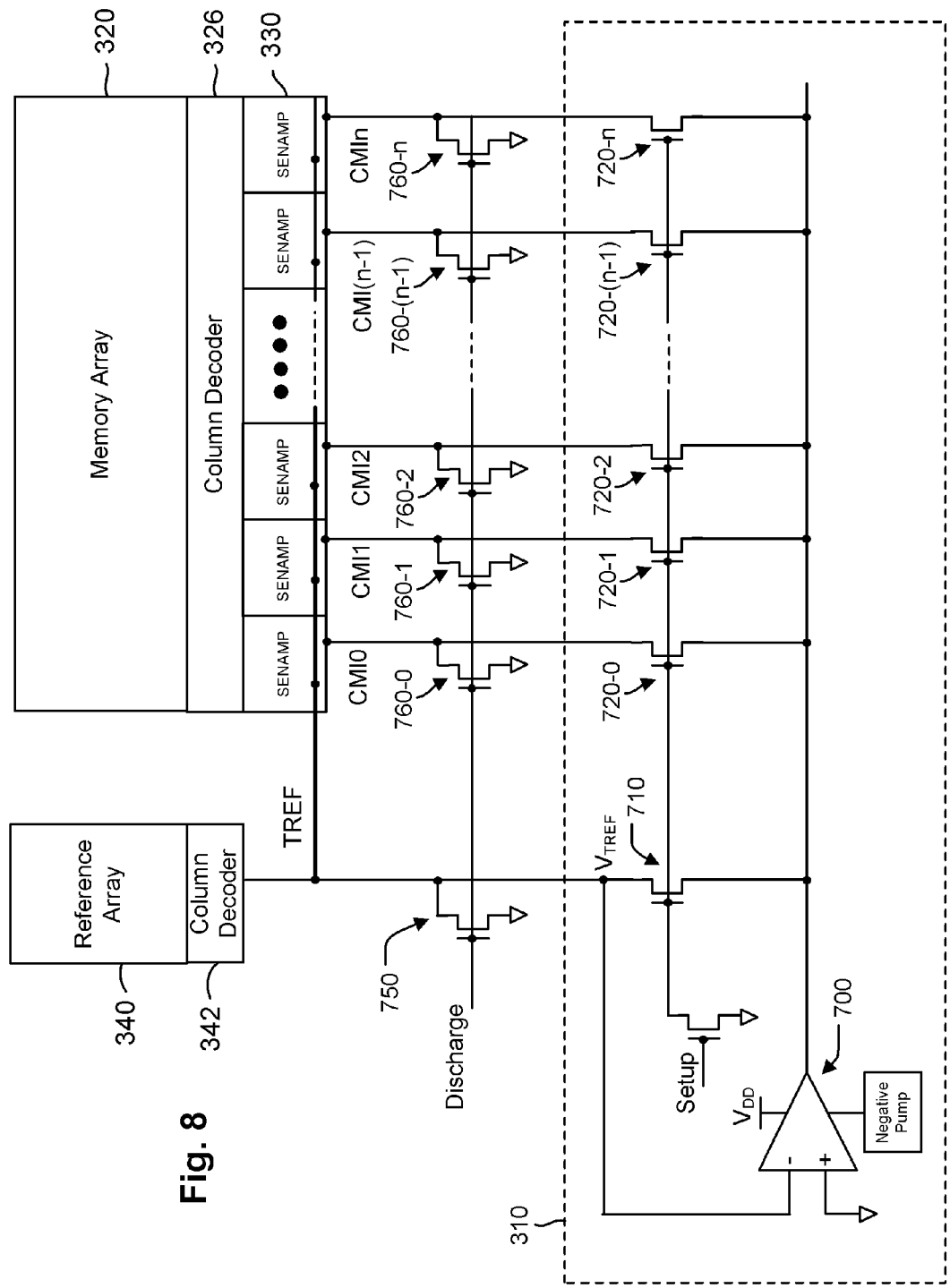
FIG. 8 is a schematic diagram of an embodiment of the current sink circuitry of FIG. 7 coupled to the memory array.

FIG. 8 illustrates the circuit of FIG. 7 coupled to a memory array 320. As shown in the schematic diagram of FIG. 8, the transistor 710 can be connected in a current mirror arrangement to each of the transistors 720-0 through 720-n in the current sink circuitry 310. The transistors 720-0 through 720-n are used to draw sink current $I_{SINK1}$ through $I_{SINKN}$ from respective sensing inputs CMI0 through CMIn of each of the (n+1) sense amplifiers of block 330 in response to the magnitude of the reference current $I_{REF}$ through transistor 710. Discharge transistors 760-0 through 760-n are used to coupled the sensing inputs CMI0 through CMIn to ground prior to the sensing operation. As also shown in FIG. 8, the operational amplifier 700 controls the reference voltage $V_{TREF}$ at the reference input of each of the (n+1) sense amplifiers of block 330. Alternatively, other configurations for biasing the reference inputs of the sense amplifiers, drawing the sink current from the sensing inputs, and providing the reference current or currents, can be used.

Figure 9:
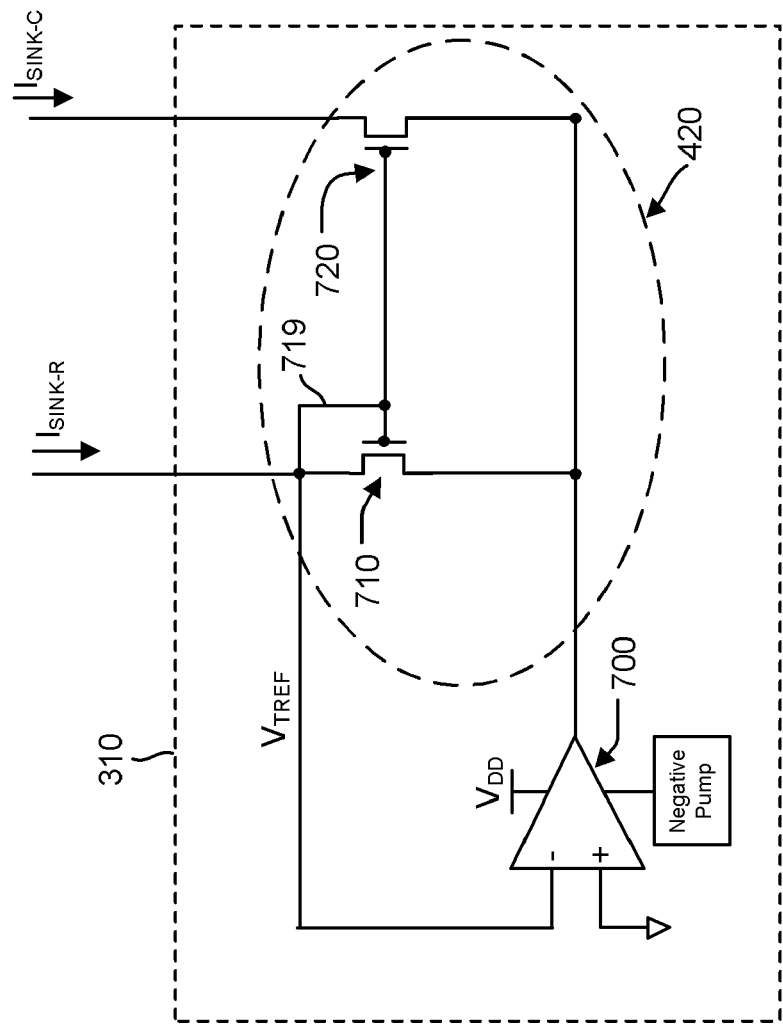
FIG. 9 is a schematic diagram of a second embodiment of the current sink circuitry.

FIG. 9 illustrates a schematic diagram of a second embodiment of the current sink circuitry 310. In FIG. 9, the set-up transistor 730 of the embodiment of FIG. 7 is omitted, and transistor 710 is diode-connected by connection 719.

Figure 10:
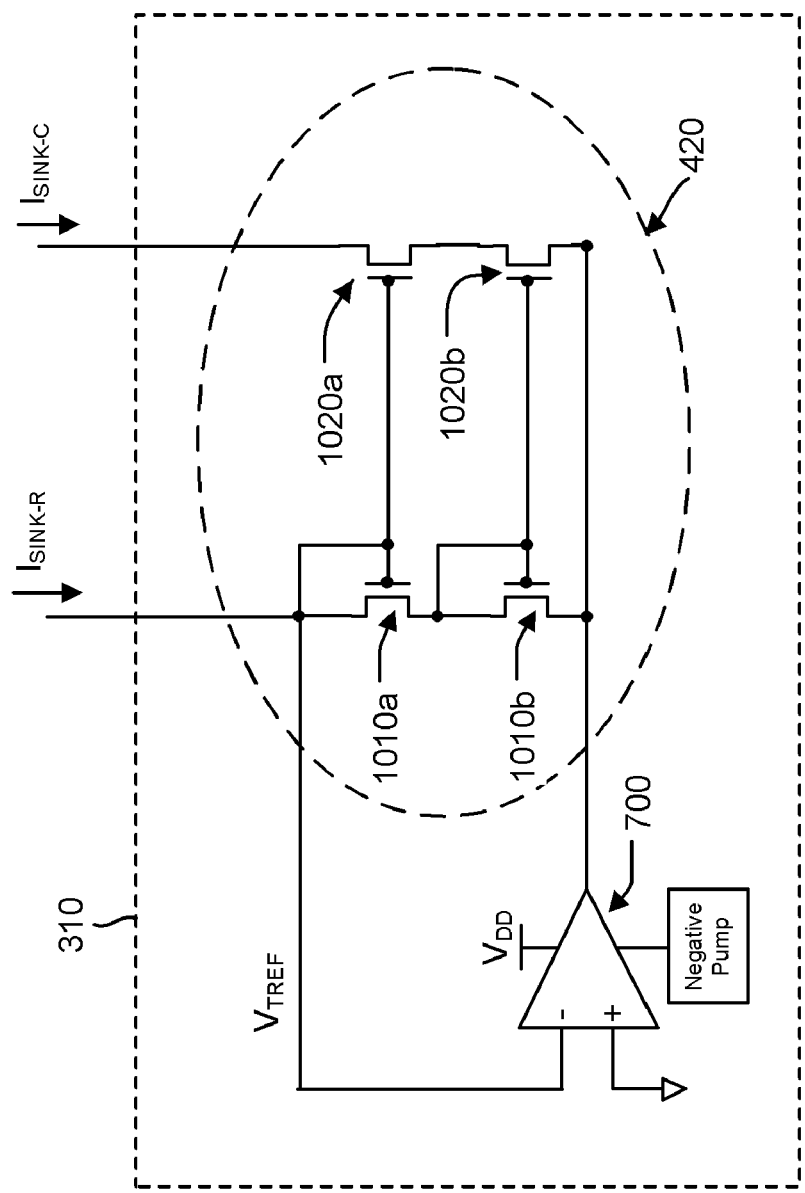
FIG. 10 is a schematic diagram of a third embodiment of the current sink circuitry.

FIG. 10 illustrates a schematic diagram of a third embodiment of the current sink circuitry 310. In FIG. 10, the input leg of the current mirror circuitry includes diode-connected transistors 1010a and 1010b arranged in series which draw the reference current $I_{REF}$. The output leg includes transistors 1020a and 1020b in series. The gates of transistors 1020a, 1020b are respectively coupled to the diode-connected transistors 1010a and 1010b, and the transistors 1020a, 1020b draw the sink current $I_{SINK}$ in response to the magnitude of the reference current $I_{REF}$.

Figure 11:
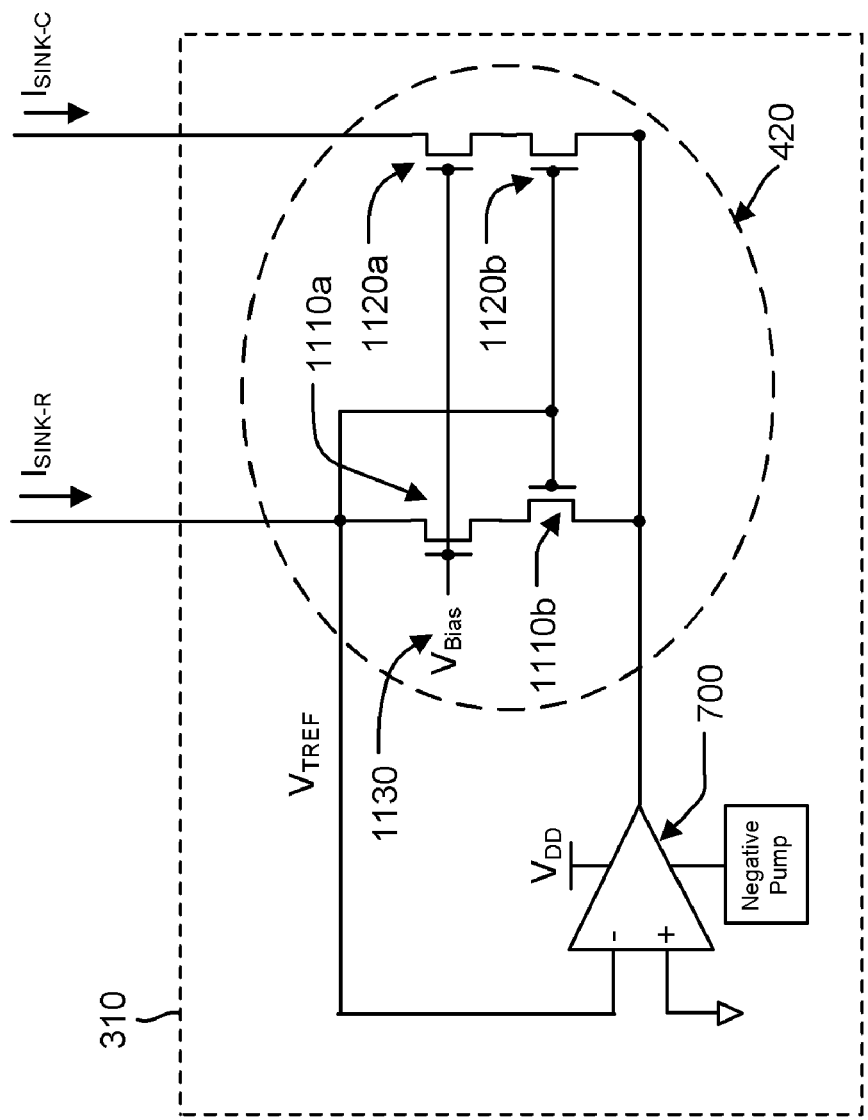
FIG. 11 is a schematic diagram of a fourth embodiment of the current sink circuitry.

FIG. 11 illustrates a schematic diagram of a fourth embodiment of the current sink circuitry 310. Transistors 1110a and 1110b arranged in series draw the reference current $I_{REF}$ provided by the reference cell. The gate of transistor 1110a is coupled to an appropriate bias voltage $V_{BIAS}$ 1130, and the gate of transistor 1110b is coupled to the reference voltage $V_{TREF}$ provided by the operational amplifier 700. The gates of transistors 1120a, 1120b are coupled to the respective gates of transistors 1110a, 1110b. The series arrangement of the transistors 1120a, 1120b draw the sink current $I_{SINK}$ in response to the magnitude of the reference current $I_{REF}$.

Figure 12:
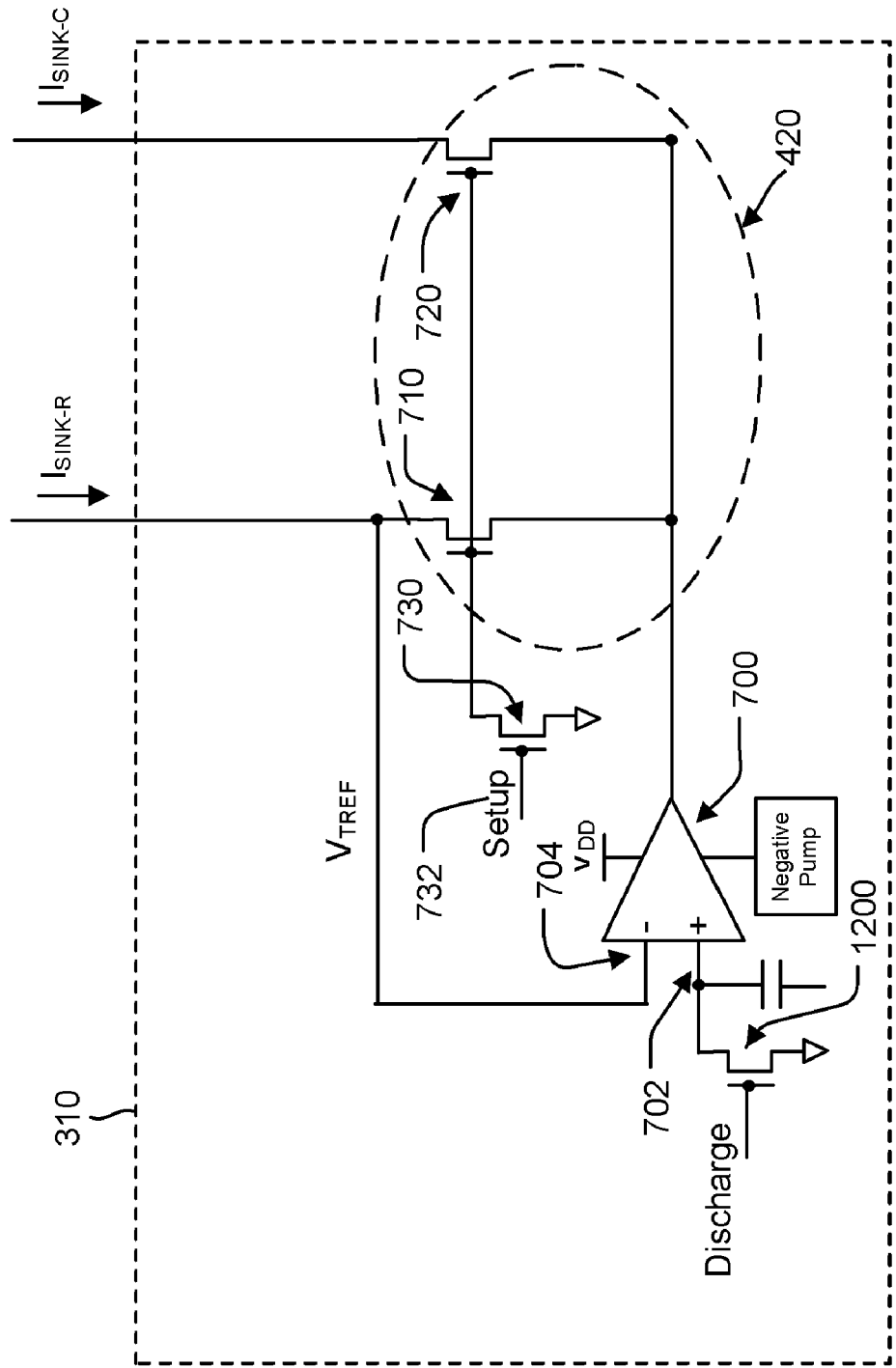
FIG. 12 is a schematic diagram of a fifth embodiment of the current sink circuitry.

FIG. 12 illustrates a schematic diagram of a fifth embodiment of the current sink circuitry 310. In FIG. 12, the first input 702 of the operational amplifier 700 is selectively coupled to a bias voltage (ground in this example) using discharge transistor 1200. This provides for discharging any node capacitance on the input of the operational amplifier just prior to sensing.

Figure 13:
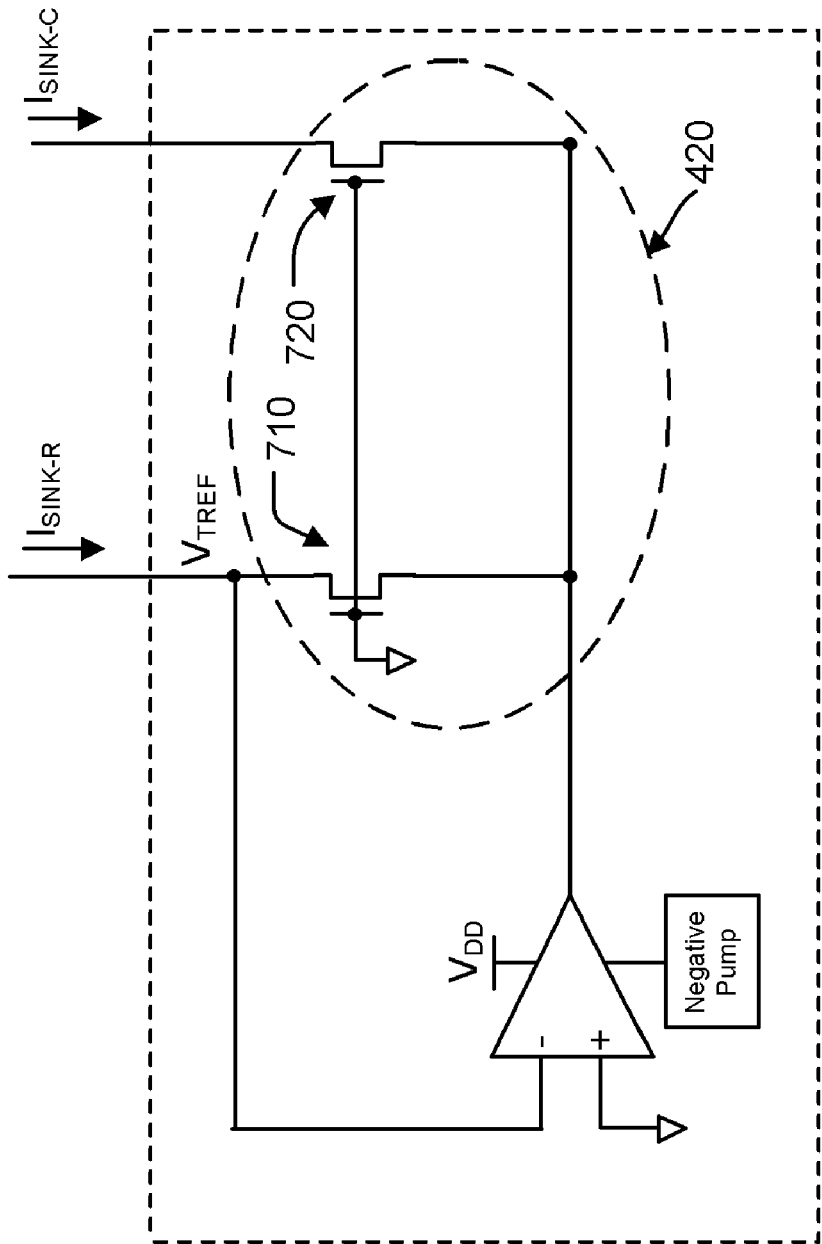
FIG. 13 is a schematic diagram of a sixth embodiment of the current sink circuitry.

FIG. 13 illustrates a schematic diagram of a sixth embodiment of the current sink circuitry 310. In FIG. 13, the setup transistor from the embodiment of FIG. 7 is omitted and the gate of transistor 710 is directly coupled to ground.

Figure 14:
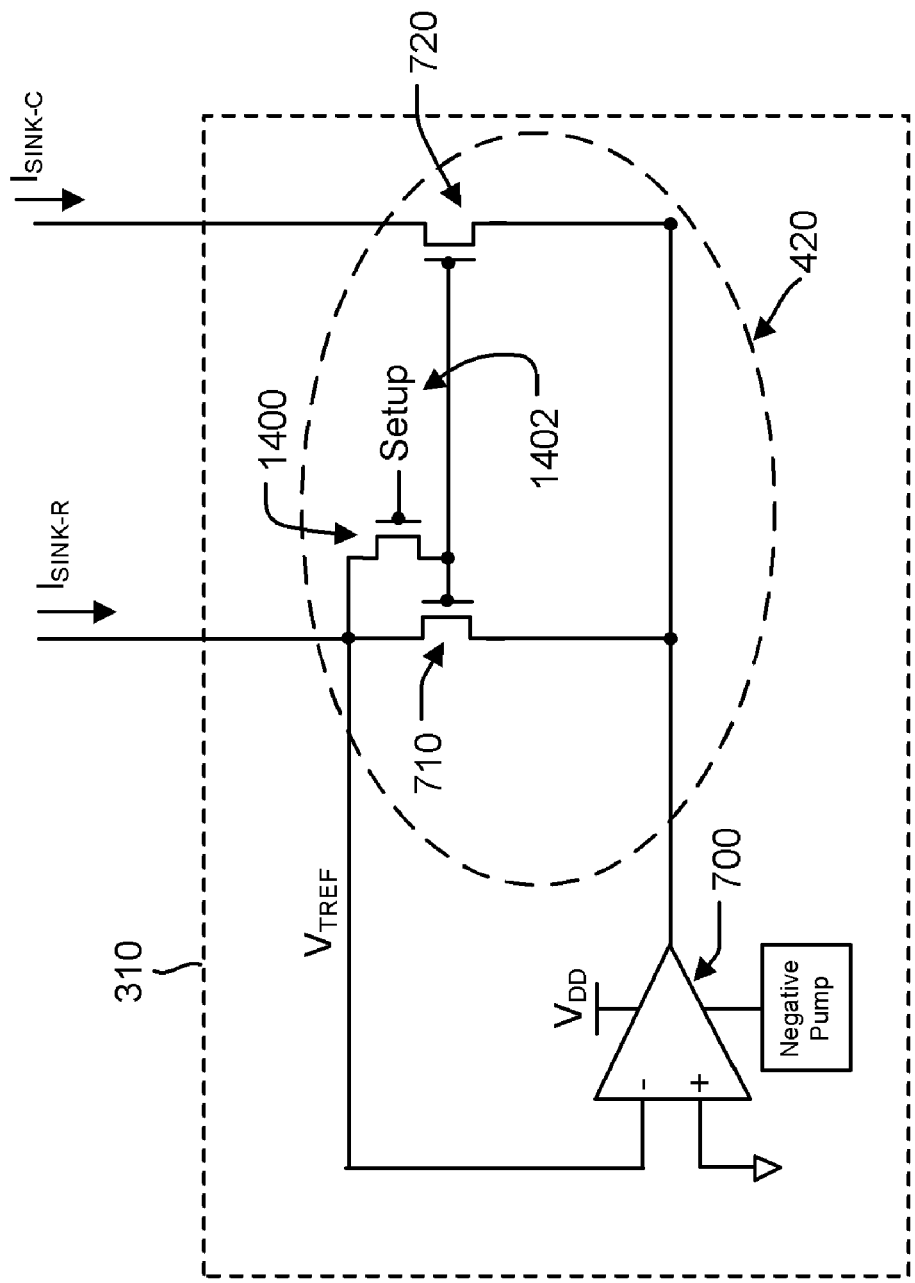
FIG. 14 is a schematic diagram of a seventh embodiment of the current sink circuitry.

FIG. 14 illustrates a schematic diagram of a seventh embodiment of the current sink circuitry 310. In FIG. 14, the transistor 710 is selectively diode-connected using setup transistor 1400 as a switch between the gate and drain. Prior to performing the sensing operation, setup signal 1402 turns on the transistor 1400 to bias the gates of the transistors 710 and 720 to the reference voltage $V_{TREF}$. During the sensing operation, the setup signal 1402 turns off the transistor 1400, so that the gates of transistors 710 and 720 are decoupled from the drain of transistor 710 during the sensing operation.

Figure 15:
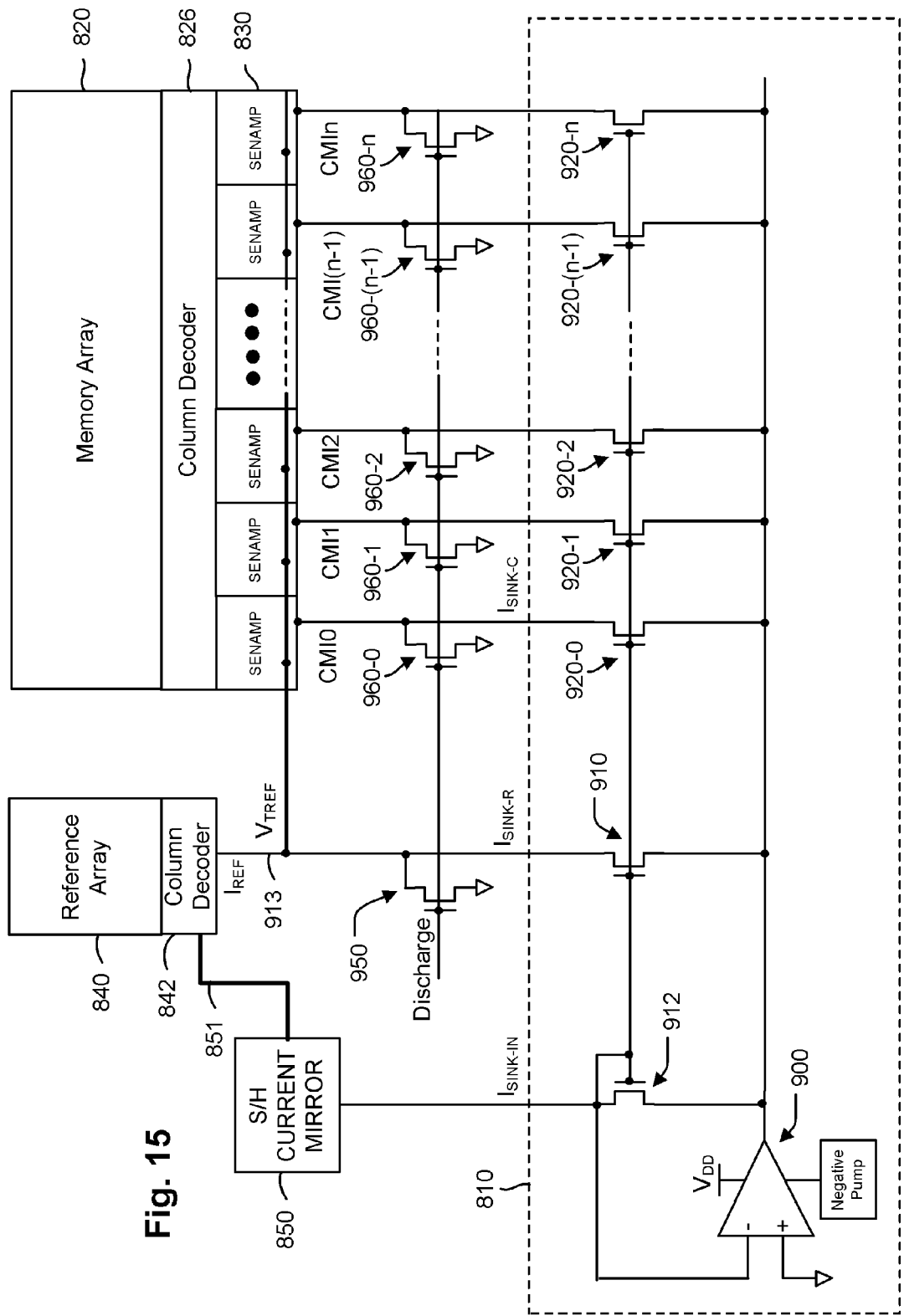
FIG. 15 is a schematic diagram of another embodiment of current sink circuitry coupled to the memory array, including a sample and hold mirror input current source.

FIG. 15 is a schematic diagram of a memory device including a regulated sink current source 810 which is responsive to a mirror input current source that can be decoupled from the reference line produced by the reference array 840. This can isolate sources of noise, such as noise from the negative charge pump 901 on the operational amplifier 900, from the reference current and the sink currents during operation of the sense amplifiers or maintain the same noise phase in such currents. The memory device includes a memory array 820 coupled to the column decoder 826. A plurality of sense amplifiers 830 are coupled to respective data lines from the source terminals of memory cells in the array 820. A reference array 840 with a corresponding column decoder 842 is used to produce reference current $I_{REF}$. As described above, discharge transistors 960-0 through 960-n are coupled to the sensing nodes in the sense amplifiers 830 pre-charging the sensing nodes to ground prior to a sensing operation. A corresponding discharge transistor 950 is coupled to the reference node in the sense amplifiers. The discharge transistors are responsive to a discharge timing signal.

Figure 16:
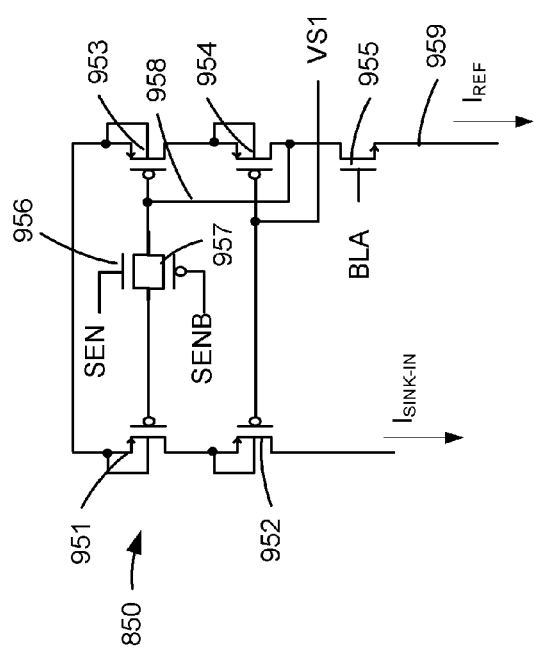
FIG. 16 is a schematic diagram of a mirror input current source suitable for use in the embodiment of FIG. 15.

The mirror input current source in this embodiment comprises a sample and hold current source 850 which is coupled to the reference current source via line 851. The sample and hold current source 850 samples a bias condition in response to the reference current during a sampling interval, and holds the bias condition while being disconnected from the reference current during the sensing interval for the sense amplifiers. One embodiment of such a sample and hold current source 850 is illustrated in FIG. 16.

The regulated sink current source includes a current mirror having input leg receiving a mirror input current $I_{SINK-IN}$ from the sample and hold current source 850, and a plurality of output legs, including one output leg supplying a sink current $I_{SINK-R}$ to the reference line 913, and one output leg for each data line supplying a sink current $I_{SINK-C}$ to the respective data lines.

In this example, the input leg is implemented using transistor 912 having a drain and a gate coupled together, and a source coupled to the output of the operational amplifier 900.

Also, the drain of the transistor 912 is coupled to the first input of the operational amplifier 900. The operational amplifier thereby regulates the drain to source voltage of the transistor 912 so as to maintain the drain terminal close to ground.

In the circuit of FIG. 15, the output legs of the current mirror in the regulated sink current source 810 comprise transistor 910 coupled to the reference line 913 and transistors 920-0 through 920-n coupled to corresponding data lines via the sensing nodes CMI0 to CMIn. The gates of the transistors 910 and 920-0 to 920-n are connected to the gate of transistor 912, and the sources of the transistors 910 and 920-0 to 920-n are coupled to the output of the operational amplifier 900 maintained the gate to source voltages equal across the transistors.

A sample and hold current source 850 is illustrated in FIG. 16. The sample and hold current source 850 includes a cascode current mirror in this example, having an input leg including p-channel transistors 953 and 954 in series between a supply potential and n-channel transistor 955 on which the reference current $I_{REF}$ is conducted. The gate of transistor 953 is coupled to the source of transistor 954 as illustrated on line 958. The sample and hold current source 850 includes an output leg supplying $I_{SINK-IN}$ including p-channel transistors 951 and 952 in series between a supply potential and the input to the regulated sink current source 810 of FIG. 15. The gates of transistors 952 and 954 are coupled together, and to a bias voltage source supplying voltage VS1, biasing the cascode current mirror. A transmission gate including n-channel transistor 956 and p-channel transistor 957 connected in parallel is coupled between the gates of transistors 951 and 953. Control signals SEN and SENB are connected to the gates of n-channel transistor 956 and p-channel transistor 957, respectively. SEN and SENB may be different than the SEN signals mentioned with reference to FIGS. 1 and 5. The gate of transistor 955 is connected to the control signal BLA. The control signal BLA controls a bias on the drain side of a referenced cell in the reference array. Thus the reference array is coupled to the line 959, in the reference current $I_{REF}$ is supplied via the reference array (not shown in FIG. 16) to the regulated sink current source.

The transmission gate is operated to connect the gates of transistors 953 and 951 during a sampling interval, and to disconnect the gates of the transistors 953 and 951 during the sensing interval of the sense amplifiers circuitry.

Figure 17:
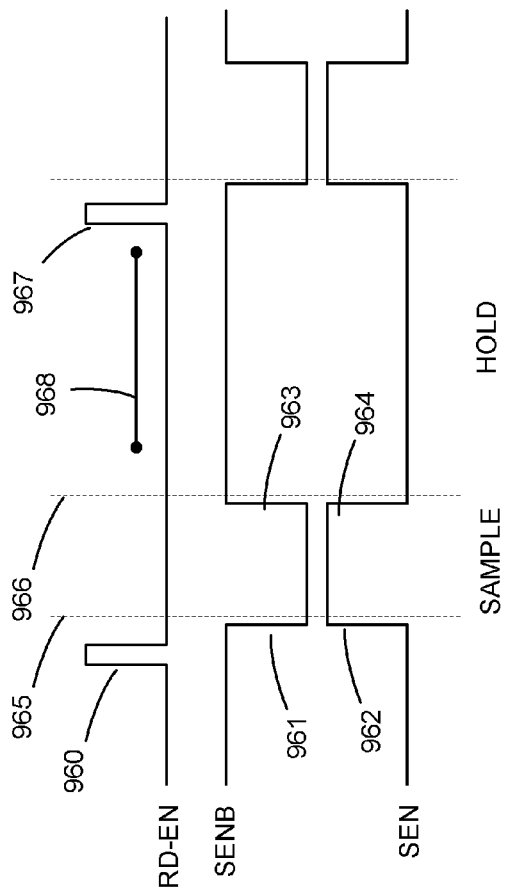
FIG. 17 is a timing diagram for control signals in the circuit of FIG. 16.

FIG. 17 provides a timing diagram. A read enable signal RD-EN generates a pulse 960 at the beginning of a read cycle. The control signals SEN and SENB switch at times 961, 962 to turn on the transmission gate. At time 963, 964 the control signals SEN and SENB switch to turn off the transmission gate. Therefore, a bias condition is established and sampled on the output leg of the current mirror during the interval between times 965 and 956. When the transmission gate is off, the bias condition is held. A sensing interval represented by the line 968 in the sensing circuitry for the array falls during the interval during which the bias condition is held, and the output leg of the current mirror is decoupled from the input leg. When a next pulse 967 occurs in the read enable signal RD-EN, the transmission gate switches again to execute the sample and hold sequence.

Figure 18:
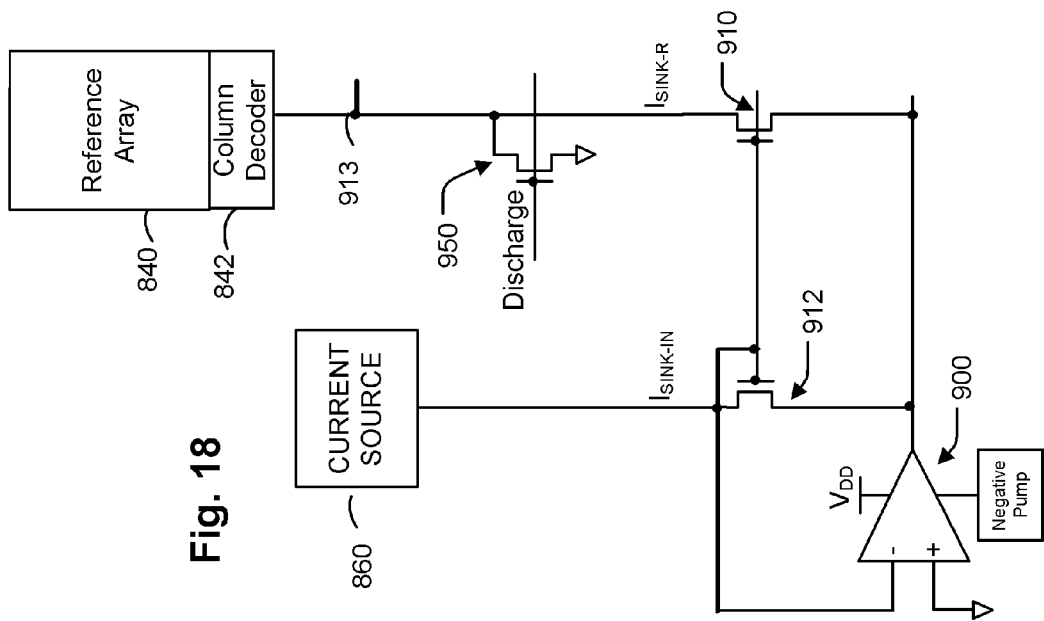
FIG. 18 is a schematic diagram of yet another embodiment of current sink circuitry having a reference input independent of the reference current source.

FIG. 18 illustrates a more general case in which the current source 860 supplying the mirror input current $I_{SINK-IN}$ is decoupled from the reference line. The reference numerals for components similar to those in FIG. 15 are not changed in this figure. The magnitude of the mirror input current $I_{SINK-IN}$ can be controlled so that the sink currents generated correlate with or emulate the reference current $I_{REF}$ in preferred embodiments, but can have magnitudes which suit a particular implementation.

Figure 19:
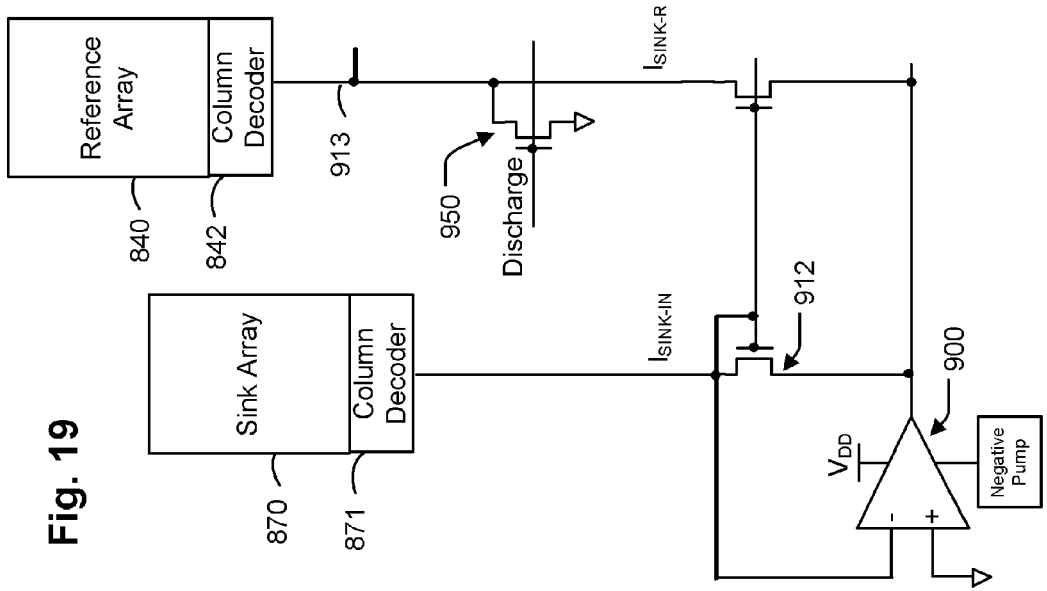
FIG. 19 is a schematic diagram of yet another embodiment of current sink circuitry having a reference input based on a reference array separate from that used for producing reference current.

FIG. 19 illustrates yet another embodiment, in which the current source used to provide the mirror input current $I_{SINK-IN}$ includes a sink reference array 870 and column decoder 871. The sink reference array 870 can have characteristics similar to those of the reference array 840, so that the mirror input current $I_{SINK-IN}$ emulates the reference current $I_{REF}$ while being decoupled from it.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
    a memory array arranged to provide a read current from a source terminal of a selected memory cell in the memory array to a data line;
    a reference current source arranged to provide a reference current to a reference node;
    a regulated sink current source coupled to the data line and to the reference current source, the sink current source arranged to draw sink currents having regulated magnitudes from the data line and the reference node; and
    sense amplifier circuitry coupled to the data line at a sensing node and to the reference node, that generates an output signal indicating a data value stored in the selected memory cell.

2. The device of claim 1, wherein the regulated sink current source controls the magnitudes of the sink currents independent of a magnitude of read current on the data line.

3. The device of claim 1, wherein the regulated sink current source controls the magnitudes of the sink currents as a function of a magnitude of reference current.

4. The device of claim 1, wherein the regulated sink current source includes a current mirror and an input coupled to a mirror input current source.

5. The device of claim 4, wherein the mirror input current source is responsive to the reference current.

6. The device of claim 4, wherein the mirror input current source includes a switch which couples the reference current source to a control terminal of the mirror input current source in a first state, and decouples the reference current source from the control terminal in a second state.

7. The device of claim 4, wherein the sense amplifier circuit senses the data value during a sensing interval, the mirror input current source including a sample and hold circuit which samples a magnitude of the reference current in a sampling interval to produce a sample bias condition, and holds the sample bias condition in the sensing interval.

8. The device of claim 4, wherein the mirror input current source is the reference current source.

9. The device of claim 1, wherein the sense amplifier circuitry is responsive to a difference between voltage or current on the reference node and voltage or current on the sensing node to generate the output signal.

10. The device of claim 1, further comprising circuitry to regulate a voltage level at an output of the sink current source.

11. The device of claim 1, wherein the regulated sink current source comprises an operational amplifier having a first input coupled to a feedback node in the regulated sink current source, and having a second input coupled to a reference voltage.

12. The device of claim 1, wherein the regulated sink current source includes a current mirror, the current mirror having an output supplying the sink current source, and an input coupled to a mirror input current source, and including a circuit to regulate a voltage level at the output of the current mirror.

13. The device of claim 1, wherein the regulated sink current source includes a current mirror, the current mirror having an output acting as the sink current source, an input coupled to a mirror input current source, and an operational amplifier having a first input coupled to the input of the current mirror and having a second input coupled to a reference voltage source.

14. The device of claim 13, wherein the reference voltage source supplies a ground potential to the second input.

15. The device of claim 1, wherein the reference current source comprises a reference cell.

16. A memory device comprising:
    a memory array arranged to provide a read current from a source terminal of a selected memory cell in the memory array to a data line;
    a reference current source arranged to provide a reference current on a reference line;
    a sink current mirror, the sink current mirror having outputs supplying a data line sink current to the data line and a reference line sink current to the reference line, an input coupled to a mirror input current source, and an operational amplifier having a first input coupled to the input of the current mirror, having a second input coupled to a reference voltage source, and having an output supplying a feedback voltage to the sink current mirror; and
    sense amplifier circuitry coupled to the data line and the reference line, the sense amplifier circuitry responsive the read current, the reference current and the data line and reference line sink currents to generate an output signal indicating a data value stored in the selected memory cell,
    wherein the sense amplifier circuit senses the data value during a sensing interval, and the mirror input current source includes a sample and hold circuit which samples a magnitude of the reference current in a sampling interval to produce a sample bias condition, and holds the sample bias condition in the sensing interval.

17. The device of claim 16, wherein the mirror input current source comprises a current mirror, having an input coupled to the reference current in the sampling interval, and having an output providing a mirror input current to the sink current mirror in the sensing interval.

18. The device of claim 16, wherein the sink current mirror includes an output leg including at least one transistor having a source node, and the feedback voltage is applied to the source node.

19. The device of claim 16, wherein the sink current mirror includes
    an input leg including an input leg transistor having a gate, and the first input of the operational amplifier is coupled to the gate of the input leg transistor, and
    an output leg including an output leg transistor having a gate coupled to the gate of the input leg transistor, and a source,
    wherein the feedback voltage is applied to regulate gate to source voltage in the input leg transistor and the output leg transistor.

20. A method for source-side sensing of data in a memory array, comprising:
supplying a read current from a source-side of a selected memory cell to a data line;
supplying a reference current on a reference line;
drawing regulated sink currents from the data line and from the reference line to produce a read sensing current in response to a difference between the read current and the regulated sink current on the data line, and to produce a reference sensing current in response to a difference between the reference current and the regulated sink current on the reference line; and
determining a data value in the selected memory cell in response to the read sensing current and the reference sensing current.

* * * * *